United States Patent
Brennan et al.

(10) Patent No.: US 9,333,692 B2
(45) Date of Patent: *May 10, 2016

(54) HYDROLYSIS RESISTANT POLYESTER FILMS

(75) Inventors: William J. Brennan, Great Ayton (GB); Simon Vernon Mortlock, Dumfries (GB); William Bryden Goldie, Dumfries (GB); Emma Ashford, Dumfries (GB); Kirstin Jayne Forsyth, Glasgow (GB); David R. Turner, New-castle-upon-Tyne (GB); Allan Lovatt, Middlesbrough (GB)

(73) Assignee: DUPONT TEIJIN FILMS U.S. LIMITED PARTNERSHIP, Chester, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/003,676

(22) PCT Filed: Mar. 7, 2012

(86) PCT No.: PCT/GB2012/000224
§ 371 (c)(1),
(2), (4) Date: Nov. 15, 2013

(87) PCT Pub. No.: WO2012/120260
PCT Pub. Date: Sep. 13, 2012

(65) Prior Publication Data
US 2014/0053901 A1 Feb. 27, 2014

Related U.S. Application Data

(60) Provisional application No. 61/449,897, filed on Mar. 7, 2011.

(30) Foreign Application Priority Data

Mar. 7, 2011 (GB) .................................. 1103855.1

(51) Int. Cl.
B32B 27/08 (2006.01)
B32B 27/18 (2006.01)
(Continued)

(52) U.S. Cl.
CPC .............. *B29C 47/0021* (2013.01); *B29D 7/01* (2013.01); *C08G 63/916* (2013.01); *C08J 5/18* (2013.01);
(Continued)

(58) Field of Classification Search
None
See application file for complete search history.

(56) References Cited

U.S. PATENT DOCUMENTS 3,244,708 A 4/1966 Duennenberger et al.
3,372,143 A 3/1968 Terada et al.
(Continued)

FOREIGN PATENT DOCUMENTS

CA 2 514 589 8/2004
CN 101412591 4/2009
(Continued)

OTHER PUBLICATIONS

Russian Office Action mailed Jun. 30, 2014 in counterpart Russian Application No. 2012113737, including translation.
(Continued)

*Primary Examiner* — Vivian Chen
(74) *Attorney, Agent, or Firm* — Ratnerprestia

(57) ABSTRACT

A biaxially oriented polyester film comprising polyester and at least one hydrolysis stabilizer selected from a glycidyl ester of a branched monocarboxylic acid, wherein the monocarboxylic acid has from 5 to 50 carbon atoms, wherein said hydrolysis stabilizer is present in the film in the form of its reaction product with at least some of the end-groups of said polyester, and wherein said reaction product is obtained by the reaction of the hydrolysis stabilizer with the end-groups of the polyester in the presence of a metal cation selected from the group consisting of Group I and Group II metal cations.

30 Claims, 1 Drawing Sheet

(51) Int. Cl.

| | | |
|---|---|---|
| *B32B 27/36* | (2006.01) | |
| *B32B 37/15* | (2006.01) | |
| *B29D 7/01* | (2006.01) | |
| *B29C 47/00* | (2006.01) | |
| *B29C 47/06* | (2006.01) | |
| *C08K 5/1515* | (2006.01) | |
| *C08J 3/20* | (2006.01) | |
| *C08L 67/02* | (2006.01) | |
| *C08L 67/03* | (2006.01) | |
| *C08G 63/91* | (2006.01) | |
| *H01L 31/048* | (2014.01) | |
| *H01L 31/049* | (2014.01) | |
| *C08J 5/18* | (2006.01) | |
| *H01L 21/64* | (2006.01) | |
| *H01L 31/056* | (2014.01) | |
| *B29K 67/00* | (2006.01) | |
| *C08K 5/10* | (2006.01) | |
| *C08K 5/00* | (2006.01) | |
| *C08K 3/00* | (2006.01) | |
| *C08K 5/101* | (2006.01) | |

(52) U.S. Cl.
CPC ............. *H01L 21/64* (2013.01); *H01L 31/048* (2013.01); *H01L 31/049* (2014.12); *H01L 31/056* (2014.12); *B29C 47/0057* (2013.01); *B29C 47/06* (2013.01); *B29K 2067/00* (2013.01); *B29K 2067/003* (2013.01); *B32B 27/08* (2013.01); *B32B 27/18* (2013.01); *B32B 27/36* (2013.01); *B32B 37/15* (2013.01); *B32B 37/153* (2013.01); *B32B 2250/02* (2013.01); *B32B 2250/03* (2013.01); *B32B 2250/244* (2013.01); *B32B 2307/402* (2013.01); *B32B 2307/41* (2013.01); *B32B 2307/412* (2013.01); *B32B 2307/50* (2013.01); *B32B 2307/712* (2013.01); *B32B 2367/00* (2013.01); *B32B 2457/12* (2013.01); *C08G 63/91* (2013.01); *C08G 63/914* (2013.01); *C08J 3/201* (2013.01); *C08J 2367/02* (2013.01); *C08J 2367/03* (2013.01); *C08K 3/0033* (2013.01); *C08K 3/0041* (2013.01); *C08K 5/005* (2013.01); *C08K 5/10* (2013.01); *C08K 5/101* (2013.01); *C08K 5/1515* (2013.01); *C08L 67/02* (2013.01); *C08L 67/03* (2013.01); *C08L 2201/08* (2013.01); *C08L 2201/10* (2013.01); *C08L 2203/204* (2013.01); *Y02E 10/52* (2013.01); *Y10T 428/31786* (2015.04)

(56) References Cited

U.S. PATENT DOCUMENTS

| | | |
|---|---|---|
| 3,657,191 A | 4/1972 | Tintzmann et al. |
| 3,843,371 A | 10/1974 | Piller et al. |
| 3,869,427 A | 3/1975 | Meschke et al. |
| 4,115,350 A | 9/1978 | Lazarus et al. |
| 4,130,541 A | 12/1978 | Lazarus et al. |
| 4,152,318 A | 5/1979 | Lazarus |
| 4,446,262 A | 5/1984 | Okumura et al. |
| 4,540,729 A | 9/1985 | Williams |
| 4,578,295 A * | 3/1986 | Jabarin ............. 428/36.92 |
| 4,619,956 A | 10/1986 | Susi |
| 4,681,905 A | 7/1987 | Kubota et al. |
| 4,684,679 A | 8/1987 | Kubota et al. |
| 4,812,498 A | 3/1989 | Nakahara et al. |
| 5,251,064 A | 10/1993 | Tennant et al. |
| 5,264,539 A | 11/1993 | Shepherd |
| 5,288,778 A | 2/1994 | Schmitter et al. |
| 5,589,126 A | 12/1996 | Shih et al. |
| 5,763,538 A * | 6/1998 | Hunter et al. ............ 525/440.04 |
| 5,885,709 A | 3/1999 | Wick et al. |
| 6,051,164 A * | 4/2000 | Samuels ............... 252/404 |
| 6,121,389 A | 9/2000 | Kooijmans |
| 6,224,016 B1 * | 5/2001 | Lee et al. ............ 244/30 |
| 6,274,805 B1 * | 8/2001 | Nakazawa et al. ........... 136/256 |
| 6,388,024 B1 * | 5/2002 | Van Gaalen et al. ......... 525/438 |
| 6,441,298 B1 * | 8/2002 | Thio ........................ 136/250 |
| 6,498,212 B1 | 12/2002 | Kao et al. |
| 6,503,616 B1 * | 1/2003 | Jalan ............................. 428/323 |
| 6,709,731 B2 * | 3/2004 | Murschall et al. ............ 428/141 |
| 6,730,406 B2 * | 5/2004 | Murschall et al. ........... 428/423.7 |
| 6,838,529 B2 * | 1/2005 | Kumazawa et al. ........... 525/438 |
| 6,881,470 B2 * | 4/2005 | Murschall et al. ............ 428/141 |
| 7,229,697 B2 | 6/2007 | Kliesch et al. |
| 7,241,507 B2 | 7/2007 | Kliesch et al. |
| 7,375,167 B2 | 5/2008 | Natarajan |
| 7,534,487 B2 * | 5/2009 | Klein et al. ................. 428/328 |
| 2001/0017429 A1 * | 8/2001 | Takahashi et al. ............ 264/141 |
| 2001/0029274 A1 | 10/2001 | Murschall et al. |
| 2002/0065346 A1 | 5/2002 | Murschall et al. |
| 2002/0099150 A1 * | 7/2002 | Kumazawa et al. ......... 525/438 |
| 2003/0068511 A1 | 4/2003 | Murschall et al. |
| 2003/0219614 A1 | 11/2003 | Kliesch et al. |
| 2004/0121803 A1 * | 6/2004 | Weinblatt et al. .......... 455/556.2 |
| 2005/0137299 A1 | 6/2005 | Berndt |
| 2005/0222345 A1 * | 10/2005 | Nakayama et al. ........... 525/419 |
| 2006/0057408 A1 | 3/2006 | Kliesch et al. |
| 2006/0057409 A1 | 3/2006 | Kliesch et al. |
| 2006/0263592 A1 | 11/2006 | Kusume et al. |
| 2006/0275593 A1 | 12/2006 | Kern et al. |
| 2007/0065649 A1 * | 3/2007 | Matsui et al. ............. 428/220 |
| 2007/0237972 A1 | 10/2007 | Kliesch et al. |
| 2007/0238816 A1 | 10/2007 | Kliesch et al. |
| 2007/0240075 A1 | 10/2007 | Jesberger et al. |
| 2008/0132631 A1 * | 6/2008 | Natarajan et al. ............ 524/423 |
| 2008/0264484 A1 * | 10/2008 | Temchenko et al. .......... 136/256 |
| 2008/0289680 A1 | 11/2008 | MacFarlane |
| 2008/0302408 A1 * | 12/2008 | Bressler et al. .............. 136/251 |
| 2009/0034235 A1 | 2/2009 | Kusume et al. |
| 2009/0078314 A1 * | 3/2009 | Temchenko et al. .......... 136/256 |
| 2009/0101204 A1 * | 4/2009 | Levy et al. .................. 136/256 |
| 2009/0139564 A1 * | 6/2009 | Miyaji et al. ................. 136/251 |
| 2009/0162589 A1 * | 6/2009 | Buchanan et al. ........... 428/35.7 |
| 2009/0211621 A1 * | 8/2009 | LeBlanc ....................... 136/244 |
| 2009/0275678 A1 | 11/2009 | Kumazawa |
| 2010/0002402 A1 * | 1/2010 | Rogers et al. ................ 361/749 |
| 2010/0071757 A1 * | 3/2010 | Krajewski et al. ........... 136/251 |
| 2010/0120946 A1 * | 5/2010 | Kliesch et al. .............. 523/400 |
| 2010/0215902 A1 * | 8/2010 | Kiehne et al. ............... 428/141 |
| 2010/0229923 A1 * | 9/2010 | Frolov et al. ............... 136/251 |
| 2010/0229924 A1 * | 9/2010 | Teranishi et al. ............ 136/252 |
| 2010/0233843 A1 * | 9/2010 | Frolov et al. .................... 438/98 |
| 2010/0243029 A1 * | 9/2010 | Higashi et al. .............. 136/244 |
| 2010/0258162 A1 * | 10/2010 | O'Brien et al. .............. 136/251 |
| 2010/0288353 A1 * | 11/2010 | Kliesch et al. .............. 136/256 |
| 2010/0307570 A1 | 12/2010 | Aoyama |
| 2010/0326517 A1 * | 12/2010 | O'Brien et al. .............. 136/256 |
| 2012/0227801 A1 * | 9/2012 | Brennan et al. ............. 136/256 |

FOREIGN PATENT DOCUMENTS

| | | |
|---|---|---|
| EP | 0 006 686 | 1/1980 |
| EP | 0 031 202 | 7/1981 |
| EP | 0 031 203 | 7/1981 |
| EP | 0 076 582 | 10/1981 |
| EP | 0 292 251 | 11/1988 |
| EP | 0 620 245 | 10/1994 |
| EP | 0 738 749 | 10/1996 |
| EP | 0 838 500 | 4/1998 |
| EP | 1 209 200 | 5/2002 |
| EP | 1 826 826 | 8/2007 |
| EP | 1 898 470 A1 | 3/2008 |
| EP | 2 184 311 | 5/2010 |
| EP | 2184312 | 5/2010 |
| EP | 2 262 000 | 12/2010 |
| EP | 2 415 599 A1 | 2/2012 |
| EP | 2 476 552 A1 | 7/2012 |
| EP | 2 495 284 A1 | 9/2012 |
| GB | 1048068 | 11/1966 |

(56) References Cited

FOREIGN PATENT DOCUMENTS

| | | | |
|---|---|---|---|
| JP | 53-147018 | * | 12/1978 |
| JP | 10-130482 | * | 5/1998 |
| JP | 2000007847 | | 1/2000 |
| JP | 2000-302114 | * | 10/2000 |
| JP | 2000302114 | | 10/2000 |
| JP | 2004165513 | | 6/2004 |
| JP | 2005325214 | | 11/2005 |
| JP | 2005325216 | | 11/2005 |
| JP | 200649541 | | 2/2006 |
| JP | 2007208179 | | 8/2007 |
| JP | 2009-155478 | * | 7/2009 |
| JP | 2009155412 | | 7/2009 |
| JP | 2009155478 | | 7/2009 |
| JP | 2009188105 | | 8/2009 |
| JP | 4501042 B2 | | 7/2010 |
| JP | 2010235824 | | 10/2010 |
| NL | 6814541 | | 10/1969 |
| SU | 192098 | | 1/1967 |
| SU | 307091 | | 1/1971 |
| WO | WO 94/05645 | | 3/1994 |
| WO | 9951659 | | 10/1999 |
| WO | 0004073 | | 1/2000 |
| WO | WO 01/56966 | | 8/2001 |
| WO | 2008001790 | | 1/2008 |
| WO | 2009069742 | | 6/2009 |

OTHER PUBLICATIONS

Cardura E10P Product Bulletin, 4 pgs., 2006.

Lohner, Pierre, International Search Report for International Application No. PCT/GB2010/001698, dated Nov. 16, 2010.

Tanaka, "Synthesis and Characterization of Epoxides," Epoxy Resins Chemistry and Technology, May and Dekker (eds.), 1988.

U.S. Office Action mailed Sep. 11, 2013 in U.S. Appl. No. 13/394,623.

U.S. Office Action mailed May 16, 2014 in U.S. Appl. No. 13/394,623.

Japanese Office Action in related Japanese Application No. JP2012-528444 dated Oct. 6, 2014.

Translation of Russian Decision on Grant of Patent for Invention in Russian Application No. 2012113737/04(020746) issued Nov. 6, 2014.

Entire patent prosecution history of U.S. Appl. No. 13/394,623, filed May 31, 2012, entitled, "Hydrolysis Resistant Polyester Films."

U.S. Office Action mailed Apr. 7, 2015 for U.S. Appl. No. 13/394,623.

Office Action mailed Aug. 17, 2015 in U.S. Appl. No. 13/394,623.

Advisory Action mailed Oct. 23, 2015 in U.S. Appl. No. 13/394,623.

Masson, Patrick, International Preliminary Report on Patentability dated Jun. 5, 2013, for International Application No. PCT/GB2012/000224, 5 pages.

Masson, Patrick, International Search Report dated May 11, 2012, for International Application No. PCT/GB2012/000224, 3 pages.

Momentiv, Technical Data Sheet, Cardura E10P Product Bulletin, Nov. 2012, 3 pages.

Resolution Performance Products, Product Data Sheet, Versatic 10, May 2002, 3 pages.

Non Final Office Action mailed Jan. 26, 2016 for U.S. Appl. No. 13/394,623.

Kent, "Plastics Profile Extrusion", Rapra Review Reports, vol. 9, No. 8 (1998), p. 10.

* cited by examiner

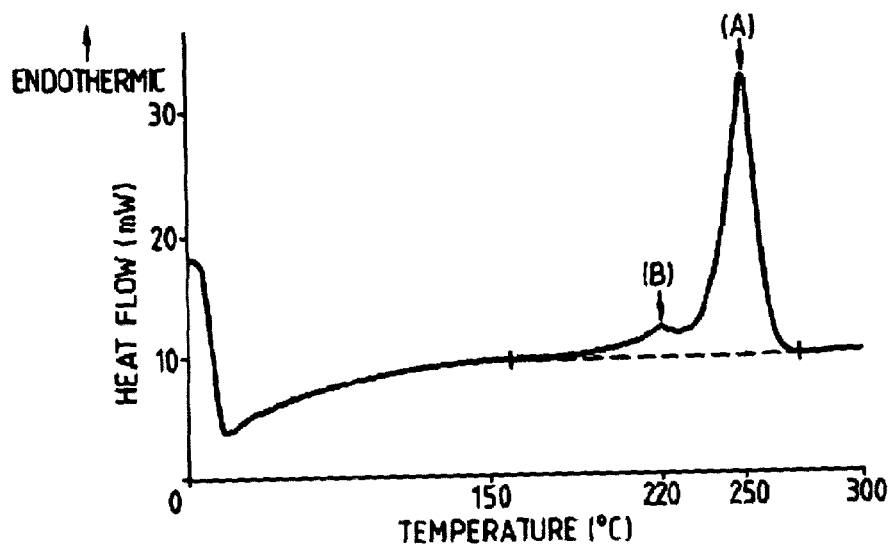

HYDROLYSIS RESISTANT POLYESTER FILMS

This application is a National Phase filing of International Application No. PCT/GB2012/000224, filed 7 Mar. 2012, and claims priority of GB Application No. 1103855.1, filed 7 Mar. 2011, and U.S. Provisional Application No. 61/449,897, filed 7 Mar. 2011, the entireties of which applications are incorporated herein by reference for all purposes.

FIELD OF THE INVENTION

The present invention is concerned with polyester films, particularly polyethylene terephthalate (PET) films, which exhibit improved hydrolysis resistance, and with a process for the production thereof.

BACKGROUND OF THE INVENTION

The advantageous mechanical properties, dimensional stability and optical properties of polyester films are well-known. However, polyester films are susceptible to hydrolytic degradation, which results in a reduction in the intrinsic viscosity of the polymer, and a consequent deterioration in one or more of the afore-mentioned desirable properties of the film, particularly the mechanical properties. Poor hydrolysis resistance is a particular problem when the film is used under humid conditions and/or elevated temperatures and/or in exterior applications, such as in photovoltaic (PV) cells.

In order to improve the hydrolysis resistance of polyester films, it is known to incorporate hydrolysis stabilisers into the film. For instance, the addition of carbodiimides as end-capping agents in polyester compositions was proposed in U.S. Pat. No. 5,885,709 and EP-0838500, amongst others, but such additives have a tendency to emit harmful gaseous by-products. US-2003/0219614-A1 reports that the use of polymeric carbodiimides as the hydrolysis stabilisers reduces the tendency for gas evolution. US-2002/0065346-A1 teaches hydrolysis stabilisers selected from a phenolic compound, an oxazoline and/or a monomeric or polymeric carbodiimide, optionally combined with an organic phosphite. GB-1048068 teaches the use of copper salts of organic carboxylic acids as hydrolysis stabilisers. U.S. Pat. No. 3,657,191 and U.S. Pat. No. 3,869,427 teach the modification of the terminal groups of the polyester by reaction with ethylene carbonates or monofunctional glycidyl ethers. Hydrolysis-resistant polyesters stabilised by the use of terminal epoxy group-containing compounds are also disclosed in EP-0292251-A. In EP-1209200 it is reported that a combination of a glycidyl ester and a glycidyl ether in the presence of a catalyst which promotes reaction between glycidyl and carboxyl groups improves the hydrolysis resistance of polyesters, although that disclosure is directed to polybutylene terephthalate (PBT), which crystallises much faster than PET, and its use in the manufacture of injection-moulded materials. U.S. Pat. No. 6,498,212 discloses polyesters in which hydrolytic stability has been improved by the use of a polymeric end-capping agent selected from epoxyethylene-ethyl acrylate copolymers, epoxystyrene-butadiene-styrene block copolymers and aminopolyethylene copolymers. The use of epoxidised fatty acid alkyl esters (such as epoxidised stearic acid 2-ethylhexyl ester) and/or epoxidised fatty acid glycerides (such as epoxidised soybean or linseed oil) as hydrolysis stabilisers in polyester compositions is disclosed in CA-2514589-A, U.S. Pat. No. 4,540,729, U.S. Pat. No. 5,589,126, U.S. Pat. No. 7,229,697, U.S. Pat. No. 7,241,507, US-2005/0137299-A1, US-2007/0238816-A1 and US-2007/0237972-A1. Other methods of improving hydrolytic stability of polyethylene terephthalate (PET) films include the simultaneous control of parameters such as intrinsic viscosity, diethylene glycol content and crystallinity, as disclosed in EP-0738749-A. The control of intrinsic viscosity and crystallinity, in combination with the presence of an antioxidant, is reported in EP-0620245-A as improving high-temperature (180° C.) ageing characteristics without detriment to in-plane delamination properties for polyester films used as insulator materials in electric motors and capacitors. U.S. Pat. No. 4,115,350 and U.S. Pat. No. 4,130,541 teach that the reaction product of polyesters with epoxidised alkyl esters of monocarboxylic acids, amides and thio-acids improves the thermal stability of the polyester in fibres and cords made therefrom. U.S. Pat. No. 3,372,143 teaches that the reaction product of polyesters with epoxidised alkoxy- or aryloxy-ethers improves the dyeability of fibres made therefrom.

One of the problems associated with the incorporation of hydrolysis stabilisers into polyester films is that while increasing the concentration of the additive improves the hydrolysis resistance, it does so at the expense of a reduction in the melting point and a deterioration in the mechanical properties of the polyester film. One of the consequences of a reduction in mechanical properties is that the processability of the filmed polyester becomes poor, and breakage of the film web occurs during manufacture and subsequent processing.

Another problem with the use in the prior art polyester films of hydrolysis stabilisers based on epoxidised fatty acids, particularly epoxidised fatty acid glycerides, is that such additives have a tendency to decompose during film manufacturing and processing with evolution of acrolein, a highly toxic, flammable and foul-smelling substance.

An additional problem with the known hydrolysis stabilisers, particularly those based on certain epoxidised fatty acid glycerides and multi-functional glycidyl compounds, is the reduction of film quality and processability when such additives are incorporated into the film in an amount effective to provide improved hydrolysis resistance. In particular, such additives induce profile defects and unacceptable levels of die-lines in polyester films, i.e. poor uniformity in thickness and/or light transmission across the film web, and the extrudate can become impossible to process on a film-line because of breakage of the film web. It is believed that such problems are at least partly attributable to cross-linking and gel formation, which interferes with the stretching process experienced by the film during its manufacture. A further problem with using multi-functional glycidyl compounds as hydrolysis stabilisers for PET is that their higher rate of chain extension of the polyester increases melt viscosity, which in turn reduces the extrusion output at a given temperature, and this is economically undesirable. While viscosity could theoretically then be reduced by increasing melt temperatures, this would lead to increased rates of degradation of the polymer and hydrolysis stabiliser and cause gel formation. Gel formation is much less problematic in the manufacture of other polyester products, such as injection moulded PBT products, in part because of the much greater thickness of those products compared to polyester film.

SUMMARY OF THE INVENTION

It is an object of this invention to provide alternative hydrolysis resistant polyester films, particularly wherein the hydrolysis resistance is improved, particularly wherein the film may be manufactured and used without the evolution of toxic by-products, particularly while maintaining or improving the ease and efficiency and economy of film manufacture without increasing film breakage, particularly wherein the level of die-lines and profile defects is reduced, and particularly without detriment to the mechanical and/or optical properties of the film.

BRIEF DESCRIPTION OF THE DRAWING

FIG. 1 is a typical Differential Scanning calorimetry scan for a polyester film according to the invention.

DETAILED DESCRIPTION OF THE INVENTION

According to the present invention, there is provided a biaxially oriented polyester film comprising polyester (preferably polyethylene terephthalate) and at least one hydrolysis stabiliser selected from a glycidyl ester of a branched monocarboxylic acid, wherein the monocarboxylic acid has from 5 to 50 carbon atoms, wherein said hydrolysis stabiliser is present in the film in the form of its reaction product with at least some of the end-groups of said polyester, and wherein the polyester film further comprises a metal cation selected from the group consisting of Group I and Group II metal cations.

In the present invention, said reaction product is obtained by the reaction of the hydrolysis stabiliser with the end-groups of the polyester in the presence of the Group I or Group II metal cations, which catalyse the reaction.

According to a further aspect of the present invention, there is provided a biaxially oriented polyester film comprising polyester (preferably polyethylene terephthalate) and at least one hydrolysis stabiliser selected from a glycidyl ester of a branched monocarboxylic acid, wherein the monocarboxylic acid has from 5 to 50 carbon atoms, wherein said hydrolysis stabiliser is present in the film in the form of its reaction product with at least some of the end-groups of said polyester, and wherein said reaction product is obtained by the reaction of the hydrolysis stabiliser with the end-groups of the polyester in the presence of a metal cation selected from the group consisting of Group I and Group II metal cations.

The hydrolysis stabiliser used in the present invention acts as an end-group capper for the polyester by reacting with the carboxyl end-groups and/or the hydroxyl end-groups of the polyester, and it is believed that the predominant reaction is with the carboxyl end-groups. Carboxyl end-groups have been demonstrated to be primarily responsible for the hydrolytic degradation of polyesters, including polyethylene terephthalate. The glycidyl group of the hydrolysis stabiliser reacts rapidly with the end-groups of the polyester at elevated temperatures and, importantly, does so with zero elimination of toxic by-products during manufacture of the modified polyester or during subsequent manufacture and use of the polyester film. The hydrolysis stabiliser is readily well incorporated into the polyester.

The metal cations are present in a catalytically active amount sufficient to catalyse the reaction between the hydrolysis stabiliser and at least some of the end-groups of said polyester.

In a preferred embodiment, the amount of the metal cation present in the film, and/or present in the reaction mixture during the reaction of the hydrolysis stabiliser with the end-groups of the polyester, is at least 40 ppm, preferably at least 45 ppm, preferably at least 65 ppm, preferably at least 80 ppm, and preferably at least 100 ppm by weight, relative to the amount of polyester produced. Preferably, the amount of the metal cation is not more than about 1000 ppm, preferably not more than about 500 ppm, preferably not more than about 275 ppm, typically not more than about 200 ppm and in one embodiment not more than about 150 ppm by weight, relative to the amount of polyester. Preferably, the amount of the metal cation is in the range from 45 ppm to 500 ppm, more preferably from 65 ppm to 275 ppm, more preferably from 100 ppm to 200 ppm by weight, relative to the amount of polyester.

In an alternative embodiment, the amount of the metal cation present in the film, and/or present in the reaction mixture during the reaction of the hydrolysis stabiliser with the end-groups of the polyester, is at least 10 ppm, preferably at least 15 ppm, preferably at least 35 ppm, preferably at least 50 ppm, and preferably at least 70 ppm by weight, relative to the amount of polyester produced. In this embodiment, the amount of the metal cation is typically not more than about 1000 ppm, not more than about 500 ppm, preferably not more than about 250 ppm, typically not more than about 150 ppm and in one embodiment not more than about 100 ppm by weight, relative to the amount of polyester. In this embodiment, the amount of the metal cation is preferably in the range from 15 ppm to 500 ppm, more preferably from 35 ppm to 250 ppm, more preferably from 70 ppm to 150 ppm by weight, relative to the amount of polyester.

As used herein, the terms "Group I" and "Group II" have their conventional chemical meaning and refer to the corresponding Groups in the periodic table. In a preferred embodiment, the metal cations are Group I metal cations, preferably sodium or potassium, preferably sodium.

The catalytic effect is believed to be a result of the cation, and therefore the corresponding anion of the catalyst can be any suitable negatively charged molecule or atom. In one embodiment, the anion is be selected from the hydroxide, polyacrylate, hydrogen carbonate, carboxylate, chloride, acetate, formate and nitrate. In a preferred embodiment, the anion is selected from hydroxide or polyacrylate. Suitable polyacrylates are those having a molecular weight of from about 1,000 to about 10,000.

The polyester film is a self-supporting film or sheet by which is meant a film or sheet capable of independent existence in the absence of a supporting base.

The polyester of said polyester film is preferably polyethylene terephthalate or polyethylene naphthalate, and more preferably polyethylene terephthalate, but it may also contain relatively minor amounts of one or more residues derived from other dicarboxylic acids and/or diols. Other dicarboxylic acids include isophathalic acid, phthalic acid, 1,4-, 2,5-, 2,6- or 2,7-naphthalenedicarboxylic acid, 4,4'-diphenyldicarboxylic acid, hexahydro-terephthalic acid, 1,10-decanedicarboxylic acid and aliphatic dicarboxylic acids of the general formula $C_nH_{2n}(COOH)_2$ wherein n is 2 to 8, such as succinic acid, glutaric acid sebacic acid, adipic acid, azelaic acid, suberic acid or pimelic acid. Other diols include aliphatic and cycloaliphatic glycols, such as 1,4-cyclohexanedimethanol. Preferably the polyester film contains only one dicarboxylic acid, i.e. terephthalic acid. Preferably the polyester contains only one glycol, i.e. ethylene glycol. The polyester resin is the major component of the film, and makes up at least 50%, preferably at least 65%, preferably at least 80%, preferably at least 90%, and preferably at least 95% by weight of the total weight of the film.

The intrinsic viscosity of the polyester from which the film is manufactured is preferably at least about 0.65, preferably at least about 0.70, preferably at least about 0.75 and preferably at least about 0.80.

Formation of the polyester is conveniently effected in a known manner by condensation or ester interchange, generally at temperatures up to about 295° C. In a preferred embodiment, solid state polymerisation may be used to increase the intrinsic viscosity to the desired value, using conventional techniques well-known in the art, for instance using a fluidised bed such as a nitrogen fluidised bed or a vacuum fluidised bed using a rotary vacuum drier.

The hydrolysis stabiliser is preferably present in an amount in the range from about 0.1% to about 5%, more preferably from about 0.1% to about 2.5%, more preferably from about 0.1% to about 2.0%, more preferably from about 0.3% to about 1.75%, more preferably from about 0.3% to about 1.5%, relative to the total weight of the film.

The branched monocarboxylic acid from which the hydrolysis stabiliser is derived has from 5 to 50 carbon atoms, preferably from 5 to 25 carbon atoms, preferably from 5 to 15 carbon atoms, preferably from 8 to 12 carbon atoms, preferably from 9 to 11 carbon atoms, and in one embodiment has 10 carbon atoms. The monocarboxylic acid is preferably saturated, i.e. the carbon-carbon bonds in the molecule are single bonds. The branched monocarboxylic acid is preferably one in which the carbon atom adjacent the carboxylic acid group (hereinafter referred to as the "α-carbon" atom) is a tertiary carbon atom, i.e. it is attached via three carbon-carbon single bonds to three carbon atoms other than the carbon atom of the carboxylic acid group, and each of said three carbon atoms may be part of an alkylene group or an alkyl group. The monocarboxylic acid is preferably a synthetic material, i.e. it is manufactured via organic synthesis comprising at least one synthetic step according to conventional procedures (see for instance WO-01/56966-A1), rather than a naturally occurring material (such as a fatty acid) which may require isolation from a naturally occurring substance.

The hydrolysis stabiliser used in the present invention may be manufactured by the known reaction of epichlorohydrin with the desired branched monocarboxylic acid. The reaction may be conducted using conventional acidic or basic catalysts, such as alkali metal carboxylates and quaternary ammonium halides, typically at elevated temperatures (temperatures in the range of 50 to 120° C. are typical).

In one embodiment, a single hydrolysis stabiliser is used in the polyester film, but in a preferred embodiment a mixture of hydrolysis stabilisers as defined herein may be used, in which case the total concentration of hydrolysis stabilisers is within the aforementioned ranges. The glycidyl ester(s) described herein is/are preferably used according to the invention in the absence of other hydrolysis stabilisers (i.e. in the absence of an hydrolysis stabiliser which is not a glycidyl ester of a branched monocarboxylic acid) and in one embodiment in the absence of glycidyl ether compound(s), particularly di- or poly-glycidyl ether compounds for the reasons given hereinabove. In one embodiment, the polyester film described herein consists essentially of polyethylene terephthalate and at least one hydrolysis stabiliser selected from a glycidyl ester of a branched monocarboxylic acid. In one embodiment of the present invention, the hydrolysis stabiliser(s) used in the present invention consist(s) essentially of at least one glycidyl ester of a branched monocarboxylic acid.

In one embodiment, the hydrolysis stabiliser has formula (I):

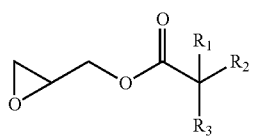
(I)

wherein:

$R^1$ and $R^2$ are independently selected from alkyl, and preferably at least one (and in one embodiment only one) of $R^1$ and $R^2$ are selected from methyl;

$R^3$ is selected from hydrogen and alkyl, and preferably from alkyl; and wherein the total number of carbon atoms in the alkyl groups $R^1$, $R^2$ and $R^3$ is from 3 to 48, preferably from 3 to 23, preferably from 3 to 13, preferably from 6 to 10, preferably from 7 to 9, and in one embodiment is 8.

In one embodiment, a mixture of hydrolysis stabilisers is used, each independently selected according to formula (I), and in one embodiment such that the total number of carbon atoms in the alkyl groups $R^1$, $R^2$ and $R^3$ in each component of the mixture is the same.

In a preferred embodiment, $R^1$ is selected from methyl, and $R^2$ and $R^3$ are independently selected from alkyl, wherein the total number of carbon atoms in the alkyl groups $R^2$ and $R^3$ is from 2 to 47, preferably from 2 to 22, preferably from 2 to 12, preferably from 5 to 9, preferably from 6 to 8, and in one embodiment is 7. In one embodiment, a mixture of these preferred hydrolysis stabilisers is used, preferably such that the total number of carbon atoms in the alkyl groups $R^1$, $R^2$ and $R^3$ in each component of the mixture is the same.

As used herein, the term "alkyl" preferably refers to an unsubstituted straight-chain acyclic hydrocarbon group of formula $[-C_nH_{2n+1}]$.

The hydrolysis stabiliser, for instance the compound of formula (I) above, may exhibit chirality, in which case the hydrolysis stabiliser may be present as either enantiomer or as a mixture of enantiomers.

In one embodiment, the hydrolysis stabiliser preferably has a viscosity of less than 100 mPa·s, preferably less than 50 mPa·s, preferably less than 25 mPa·s at 20° C., measured according to ASTM D445.

The hydrolysis stabiliser used in the present invention reacts with the polyester at elevated temperatures, typically between about 160° C. and 300° C., and does so with rapid reaction times, typically much less than 1 second at 290° C.

The hydrolysis stabiliser can be introduced at various stages during the film making process, namely:

1. By adding the additive during manufacture of the polyester from its monomers, and this would normally be effected at the end of the polymerisation process, immediately prior to extrusion into pellets. In one embodiment, the modified polyester may then be further treated by solid state polymerisation in order to increase the IV to a desired value.
2. By reacting the additive with the polyester chip off-line by melting the chip, mixing the melt with the additive, then re-extruding and pelletising the modified polyester into chips.
3. By adding the additive (typically wherein the additive is a liquid) to the polymer chip prior to or during the introduction of the polymer into the extruder used in the film-manufacturing process (for instance by adding the additive to the polymer in the hopper of the extruder), and then extruding this mixture allowing the additive and the polyester to react together in the extruder (typically a twin-screw extruder).
4. By injecting the additive (typically wherein the additive is a liquid) into the molten polymer resulting from the extrusion process (i.e. once the polymer is in the molten state within the extruder, typically a twin-screw extruder, and typically after the polymer has passed through any devolatilisation zone) but prior to the polymer being cast into a film.

5. By adding the additive during manufacture of the polyester from its monomers, which is preferably effected at the end of the polymerisation process, prior to direct extrusion into a film. The direct extrusion process is referred to herein as "coupled polymerisation-film production" or "close-coupled polymerisation-film production", in which the intermediate step of pelletisation is dispensed with, and is particularly advantageous. A close-coupled process may be operated with a static or dynamic mixing arrangement between polymerisation reactor and film die, wherein the mixing is effected after addition of the hydrolysis stabiliser. Static and dynamic mixing systems are conventional in the art. In a static mixing arrangement, the arrangement of non-moving elements continuously blends the materials as the melt-stream flows through the mixer. Suitable dynamic mixing systems include extruders or other archimedean screw systems. In a preferred embodiment of the present invention, the close-coupled process is operated with a static mixing arrangement, and the inventors surprisingly observed that sufficient mixing to achieve the benefits of the invention can be obtained with only a static mixing arrangement. It is surprising that a close-coupled process applied to this system is able to dispense with dynamic mixing without detriment to the final film properties. In the close-coupled process, an intervening solid state polymerisation step may be, and preferably is, avoided. The close-coupled process reduces the amount of water present in the polymer, thereby avoiding the need for a drying step prior to film formation, and also reducing the amount of water present in the polymeric matrix available for reaction with the hydrolysis stabiliser. The reduced water content allows the intervening solid state polymerisation step to be dispensed with, and allows the polyester film to tolerate a higher carboxyl end-group content without loss of hydrolytic stability. Thus, in this embodiment, the carboxyl end-group content is typically in the range of from about $15\times10^{-6}$ to about $50\times10^{-6}$ milliequivalents/g (meq/g), more typically from about $20\times10^{-6}$ to about $40\times10^{-6}$ meq/g, whereas a typical SSP process reduces the carboxyl end-group content to less than about $15\times10^{-6}$ meq/g, and typically about $10\times10^{-6}$ meq/g. Carboxyl content is determined by titration with sodium hydroxide after dissolution of the polymer in hot benzyl alcohol.

In one embodiment, the hydrolysis stabiliser is introduced via one of routes (2), (3) and (4) above, preferably via route (4). In one embodiment, a masterbatch is produced by adding an excess amount of hydrolysis stabiliser, relative to the amount desired in the final film, and this is of particular utility for process route (2) above. In a further preferred embodiment, the hydrolysis stabiliser is introduced via route (5).

In this invention, the metal cation(s) may be added to the polyester or its monomers prior to or simultaneously with, the addition of the hydrolysis stabiliser. Alternatively, the metal cation(s) may be added to the hydrolysis stabiliser prior to or simultaneously with the addition of said hydrolysis stabiliser to the polyester or its monomers. Preferably, the metal cation(s) are added to the polyester or its monomers, and preferably prior to the addition thereto of the hydrolysis stabiliser. In a preferred embodiment, the metal cations are added at the start of the polymerisation reaction to prepare the polyester.

The inventors observed surprisingly improved product performance using process route (4), and in particular films manufactured by this route demonstrate improved hydrolytic stability, relative to films manufactured using masterbatch technology with route (2) above. It is believed that the relatively late addition of hydrolysis stabiliser to the polyester in the extrusion process minimises the increase of carboxyl end-groups caused by thermal degradation during film manufacture. In addition, the advantage of route (4) over the masterbatch route, for example, is that it allows greater use of reclaim film (i.e. waste film from the film manufacturing process, for instance, resulting from "edge-trimming" typically performed after the stenter stage in order to provide a film of uniform width). Reclaimed polyester typically has a lower intrinsic viscosity, and a higher concentration of carboxyl end-groups, than virgin polyester chip and the relatively late addition of the hydrolysis stabiliser allows stabilisation of both the virgin and reclaim polyester. The ability to use higher levels of reclaim while providing improved hydrolysis stability is a particular advantage of the present invention.

Surprisingly improved product performance was also observed using process route (5), again in terms of improved hydrolytic stability.

In one embodiment, the film may further a UV-absorber. The UV-absorber has an extinction coefficient much higher than that of the polyester such that most of the incident UV light is absorbed by the UV-absorber rather than by the polyester. The UV-absorber generally dissipates the absorbed energy as heat, thereby avoiding degradation of the polymer chain, and improving the stability of the polyester to UV light. Typically, the UV-absorber is an organic UV-absorber, and suitable examples include those disclosed in Encyclopaedia of Chemical Technology, Kirk-Othmer, Third Edition, John Wiley & Sons, Volume 23, Pages 615 to 627. Particular examples of UV-absorbers include benzophenones, benzotriazoles (U.S. Pat. No. 4,684,679, U.S. Pat. No. 4,812,498 and U.S. Pat. No. 4,681,905), benzoxazinones (U.S. Pat. No. 4,446,262, U.S. Pat. No. 5,251,064 and U.S. Pat. No. 5,264,539) and triazines (U.S. Pat. No. 3,244,708, U.S. Pat. No. 3,843,371, U.S. Pat. No. 4,619,956, U.S. Pat. No. 5,288,778 and WO 94/05645). The UV-absorber may be incorporated into the film according to one of the methods described herein. In one embodiment, the UV-absorber may be chemically incorporated in the polyester chain. EP-A-0006686, EP-A-0031202, EP-A-0031203 and EP-A-0076582, for example, describe the incorporation of a benzophenone into the polyester. The specific teaching of the aforementioned documents regarding UV-absorbers is incorporated herein by reference. In a particularly preferred embodiment, improved UV-stability in the present invention is provided by triazines, more preferably hydroxyphenyltriazines, and particularly hydroxyphenyltriazine compounds of formula (II):

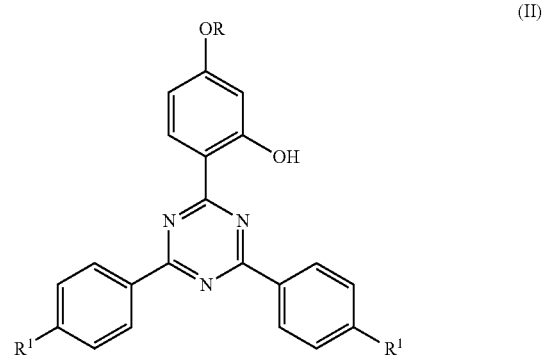

wherein R is hydrogen, $C_1$-$C_{18}$ alkyl, $C_2$-$C_6$ alkyl substituted by halogen or by $C_1$-$C_{12}$ alkoxy, or is benzyl and $R^1$ is hydrogen or methyl. R is preferably $C_1$-$C_{12}$ alkyl or benzyl, more preferably $C_3$-$C_6$ alkyl, and particularly hexyl. $R^1$ is preferably hydrogen. An especially preferred UV-absorber is 2-(4, 6-diphenyl-1,3,5-triazin-2-yl)-5-(hexyl)oxyphenol, which is commercially available as Tinuvin™ 1577 FF from Ciba-Additives.

The amount of UV-absorber is preferably in the range from 0.1% to 10%, more preferably 0.2% to 7%, more preferably 0.6% to 4%, particularly 0.8% to 2%, and especially 0.9% to 1.2% by weight, relative to the total weight of the film.

The film preferably also comprises an anti-oxidant. A range of antioxidants may be used, such as antioxidants which work by trapping radicals or by decomposing peroxide. Suitable radical-trapping antioxidants include hindered phenols, secondary aromatic amines and hindered amines, such as Tinuvin™ 770 (Ciba-Geigy). Suitable peroxide-decomposing antioxidants include trivalent phosphorous compounds, such as phosphonites, phosphites (e.g. triphenyl phosphate and trialkylphosphites) and thiosynergists (e.g. esters of thiodipropionic acid, such as dilauryl thiodipropionate). Hindered phenol antioxidants are preferred. A particularly preferred hindered phenol is tetrakis-(methylene 3-(4'-hydroxy-3',5'-di-t-butylphenyl propionate) methane, which is commercially available as Irganox™ 1010 (Ciba-Geigy). Other suitable commercially available hindered phenols include Irganox™ 1035, 1076, 1098 and 1330 (Ciba-Geigy), Santanox™ R (Monsanto), Cyanox™ antioxidants (American Cyanamid) and Goodrite™ antioxidants (BF Goodrich). The concentration of antioxidant present in the polyester film is preferably in the range from 50 ppm to 5000 ppm of the polyester, more preferably in the range from 300 ppm to 1500 ppm, particularly in the range from 400 ppm to 1200 ppm, and especially in the range from 450 ppm to 600 ppm. A mixture of more than one antioxidant may be used, in which case the total concentration thereof is preferably within the aforementioned ranges. Incorporation of the antioxidant into the polyester may be effected by conventional techniques, and preferably by mixing with the monomeric reactants from which the polyester is derived, particularly at the end of the direct esterification or ester exchange reaction, prior to polycondensation.

The film may further comprise any other additive conventionally employed in the manufacture of polyester films. Thus, agents such as cross-linking agents, dyes, fillers, pigments, voiding agents, lubricants, radical scavengers, thermal stabilisers, flame retardants and inhibitors, anti-blocking agents, surface active agents, slip aids, gloss improvers, pro-degradents, viscosity modifiers and dispersion stabilisers may be incorporated as appropriate. Such components may be introduced into the polymer in a conventional manner. For example, by mixing with the monomeric reactants from which the film-forming polymer is derived, or the components may be mixed with the polymer by tumble or dry blending or by compounding in an extruder, followed by cooling and, usually, comminution into granules or chips. Masterbatching technology may also be employed.

The film may, in particular, comprise a particulate filler which can improve handling and windability during manufacture, and can be used to modulate optical properties. The particulate filler may, for example, be a particulate inorganic filler (e.g. metal or metalloid oxides, such as alumina, titania, talc and silica (especially precipitated or diatomaceous silica and silica gels), calcined china clay and alkaline metal salts, such as the carbonates and sulphates of calcium and barium). Any inorganic filler present should be finely-divided, and the volume distributed median particle diameter (equivalent spherical diameter corresponding to 50% of the volume of all the particles, read on the cumulative distribution curve relating volume % to the diameter of the particles—often referred to as the "D(v,0.5)" value) thereof is preferably in the range from 0.01 to 5 µm, more preferably 0.05 to 1.5 µm, and particularly 0.15 to 1.2 µm. Preferably at least 90%, more preferably at least 95% by volume of the inorganic filler particles are within the range of the volume distributed median particle diameter ±0.8 µm, and particularly ±0.5 µm. Particle size of the filler particles may be measured by electron microscope, coulter counter, sedimentation analysis and static or dynamic light scattering. Techniques based on laser light diffraction are preferred. The median particle size may be determined by plotting a cumulative distribution curve representing the percentage of particle volume below chosen particle sizes and measuring the 50th percentile.

Formation of the polyester film may be effected by conventional extrusion techniques well-known in the art. In general terms the process comprises the steps of extruding a layer of molten polymer at a temperature within the range of from about 280 to about 300° C., quenching the extrudate and orienting the quenched extrudate. Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the $T_g$ of the polyester, preferably about 15° C. higher than the $T_g$. Greater draw ratios (for example, up to about 8 times) may be used if orientation in only one direction is required. It is not necessary to stretch equally in the machine and transverse directions although this is preferred if balanced properties are desired.

A stretched film may be, and preferably is, dimensionally stabilised by heat-setting under dimensional support at a temperature above the glass transition temperature of the polyester but below the melting temperature thereof, to induce the desired crystallisation of the polyester. During the heat-setting, a small amount of dimensional relaxation may be performed in the transverse direction (TD) by a procedure known as "toe-in". Toe-in can involve dimensional shrinkage of the order 2 to 4% but an analogous dimensional relaxation in the process or machine direction (MD) is difficult to achieve since low line tensions are required and film control and winding becomes problematic. The actual heat-set temperature and time will vary depending on the composition of the film and its desired final thermal shrinkage but should not be selected so as to substantially degrade the toughness properties of the film such as tear resistance. Within these constraints, a heat set temperature of about 180 to 245° C. is generally desirable. In one embodiment, the heat-set-temperature is within the range of from about 200 to about 225° C., which provides unexpected improvements in hydrolytic stability. After heat-setting the film is typically quenched rapidly in order induce the desired crystallinity of the polyester.

In one embodiment, the film may be further stabilized through use of an in-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 to about 2.5 kg/m, and typically in the range of 1.5 to 2 kg/m of film width. For a relaxation process which controls the film speed, the reduction in film speed (and therefore the strain relaxation) is typically in the range 0 to 2.5%, preferably 0.5 to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135 to 250° C. is generally desirable, preferably 150 to 230° C., more preferably 170 to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

The thickness of the polyester film is preferably in the range of from about 5 to about 500 µm, and more preferably no more than about 250 µm, and typically between about 37 µm and 150 µm.

In one embodiment, the film is opaque, and such films are of particular use as the back-plane in a PV-cell. An opaque film preferably exhibits a Transmission Optical Density (TOD) of at least 0.4, preferably at least 0.5, preferably at least 0.6, preferably at least 0.7, preferably at least 1.0 and preferably at least 1.5, and in one embodiment preferably at least 2.0, preferably at least 3.0, and preferably at least 4.0. An opaque film may be pigmented as required, and in one embodiment of the invention, the film of the invention is white, grey or black. Any suitable opacifying agent and/or whitening agent may be used, as is known in the art.

In a further embodiment, the film is white, which may be effected by incorporation therein of an effective amount of a whitening agent. Suitable whitening agents include a particulate inorganic filler such as those referred to hereinabove, an incompatible resin filler, or a mixture of two or more such fillers. Preferably the whitening agent is a particulate inorganic filler, preferably titanium dioxide and/or barium sulphate, and in a preferred embodiment the filler is barium sulphate alone. The amount of inorganic filler incorporated into the film is typically in the range of from 5% to 30% by weight, preferably 10% to 25% by weight, based on the weight of polyester in the layer. A white film preferably exhibits a whiteness index, measured as herein described, in the range of from about 80 to about 120 units. A white film typically exhibits a TOD in the range from 0.4 to 1.75, preferably at least 0.5, preferably at least 0.6, preferably at least 0.7.

In an alternative embodiment, the film is grey or black, typically exhibiting a TOD of at least 2.0, more typically at least 3.0, more typically at least 4.0, and this may be achieved by incorporation therein of an effective amount of an opacifying agent, such as carbon black, or a metallic filler such as aluminium powder, as is known in the art. Carbon black is a preferred opacifying agent. Typically, such a film comprises in the range of from about 0.3% to about 10%, preferably 0.5% to 7%, particularly 1% to 5%, and especially 2% to 4% of opacifying agent, by weight based on the weight of the polyester. The opacifying agent suitably has a mean particle diameter in the range from 0.01 to 1.5 µm, particularly 0.02 to 0.05 µm. Such an opaque film may optionally also contain a whitening agent.

In a preferred embodiment, the polyester film is translucent or optically clear. As defined herein, an optically clear film has a % of scattered visible light (haze) of no more than 30%, preferably no more than 15% preferably no more than 10%, preferably no more than 6%, more preferably no more than 3.5% and particularly no more than 1.5%, and/or a total luminous transmission (TLT) for light in the visible region (400 nm to 700 nm) of at least 80%, preferably at least 85%, more preferably at least about 90%, and preferably an optically clear film exhibits both of these haze and TLT criteria. A translucent film may have a TLT of at least 50%, preferably at least 60%, and preferably at least 70%. In this embodiment, any filler in the film is primarily for the purpose of improving handling of the film and is typically present in only small amounts, generally not exceeding about 0.5% and preferably less than about 0.3% by weight of the polyester, and is typically selected from silica and talc, preferably silica. Titanium dioxide may also be of utility in this embodiment, for instance in order to modulate the translucency of the film, as required, and is also typically present in only small amounts, generally not exceeding about 1.0%, more typically no more than about 0.5% and preferably no more than about 0.3% by weight of the polyester. In this embodiment, the windability of the film (i.e. the absence of blocking or sticking when the film is would up into a roll) is improved, without an unacceptable reduction in haze or other optical properties.

The intrinsic viscosity of the polyester film is preferably at least 0.65, preferably at least 0.7, and in one embodiment in the range of from about 0.65 to about 0.75. The use of polyester films with a relatively high intrinsic viscosity provides improved hydrolysis stability.

In one embodiment, the polyester of the polyester film exhibits an endothermic high temperature peak at a temperature of $(A)° C.$ and an endothermic low temperature peak at a temperature of $(B)° C.$, both peaks being measured by differential scanning calorimetry (DSC), wherein the value of $(A-B)$ is in the range from 15° C. to 50° C., preferably in the range from 15° C. to 45° C., more preferably in the range from 15° C. to 40° C., and in one embodiment in the range from 20° C. to 40° C., and this characteristic may be achieved as disclosed herein by control of the heat-setting temperature for the particular polyester being used. The advantage of exhibiting $(A-B)$ values within the ranges disclosed herein is that a surprising improvement in hydrolytic stability is obtained.

The polyester film preferably exhibits a low shrinkage, preferably less than 3% at 150° C. over 30 minutes, preferably less than 2%, preferably less than 1.5%, and preferably less than 1.0%, particularly in the machine (longitudinal dimension) of the film, particularly a biaxially oriented film, and preferably such low shrinkage values are exhibited in both dimensions of the film (i.e. the longitudinal and transverse dimensions).

As well as improved hydrolysis resistance, the polyester films of the present invention exhibit a surprising improvement in film uniformity and quality, relative to the prior art films, particularly those containing hydrolysis stabilisers comprising epoxidised fatty acid glycerides. In particular, the films of the present invention exhibit fewer profile defects and/or die-lines; improved uniformity in thickness and light transmission across the film web; and improved processability, with no defects or breakage in the film web.

In one embodiment, the film described hereinabove may have one or more additional layers disposed on one or both surfaces thereof, to form a composite structure, for instance to provide additional mechanical strength or electrical insulation. Formation of such a composite structure may be effected by co-extrusion, either by simultaneous coextrusion of the respective film-forming layers through independent orifices of a multi-orifice die, and thereafter uniting the still molten layers or, preferably, by single-channel coextrusion in which molten streams of the respective polymers are first united within a channel leading to a die manifold, and thereafter extruded together from the die orifice under conditions of streamline flow without intermixing thereby to produce a multi-layer film, which may be oriented and heat-set as hereinbefore described. Other methods of forming a multilayer film include the lamination of two or more pre-formed layers, and the coating of a film-forming layer onto one or both surfaces of a base layer. Coating may be effected using any suitable coating technique, including gravure roll coating, reverse roll coating, dip coating, bead coating, extrusion-coating, melt-coating or electrostatic spray coating. Any coating step preferably avoids the use of organic solvent, and is preferably conducted "in-line", i.e. wherein the coating step takes place during film manufacture and before, during or between any stretching operation(s) employed.

Any additional layer is preferably selected from the polyesters derived from the dicarboxylic acids and diols described hereinabove, and preferably from PET or PET-based polyesters. Any additional layer may comprise any of the additives mentioned above, particularly one or more additives independently selected from hydrolysis stabiliser(s), UV-absorber(s), anti-oxidant(s) and particulate inorganic filler(s), wherein the additive(s) in any additional layer may be the same as or different to any such additive in the film of the present invention described hereinabove, and wherein said additive(s) and particularly the hydrolysis stabiliser(s) may be the same as or different to those described hereinabove. The additional layer has a thickness preferably in the range of from about 50 to about 500 μm, more preferably no more than about 250 μm, and typically between about 100 μm and 250 μm, preferably between about 100 μm and 150 μm.

In one embodiment of the present invention, the film described hereinabove has disposed on a first surface thereof an additional polymeric layer, preferably without any further layer on the second surface of said film. In this embodiment, the film of the present invention is preferably an opaque or white film, and the additional polymeric layer is preferably transparent, with a haze of no more than about 30%, typically no more than about 20%, and in one embodiment no more than about 15%. The film according to this embodiment of the present invention is of particular use as a back-plane in a PV cell.

The film of the present invention is intended and adapted for use in any environment in which hydrolytic stability is critical, for instance under humid conditions and elevated temperatures, and in exterior applications, and of particular interest here are photovoltaic (PV) cells. A PV cell is a multilayer assembly typically comprising a front-plane, electrode layers, a photovoltaic-active layer, and a back-plane. Dye-sensitised PV cells are of particular interest, in which the active light-absorbing layer comprises a dye which is excited by absorbing incident light. The film of the present invention is of particular use as, or as a layer present in, the front-plane or the back-plane of the PV cell, particularly the back-plane.

According to a further aspect of the present invention, there is provided a photovoltaic cell comprising front-plane, electrode layers, a photovoltaic-active layer, and a back-plane, wherein the front-plane and/or the back-plane comprises a film of the present invention, and particularly wherein at least the back-plane comprises a film of the present invention.

According to a further aspect of the present invention, there is provided a photovoltaic cell comprising front-plane (which may be a flexible polymeric front-plane or a glass front-plane), electrode layers, a photovoltaic-active layer, and a back-plane, typically wherein the electrode layers and photovoltaic-active layer are encapsulated in a suitable encapsulant (such as an ethylene vinyl acetate (EVA) resin matrix) as is known in the art, and wherein the back-plane comprises a film of the present invention, preferably wherein said film is an opaque or white film, and preferably wherein said film has disposed on a first surface thereof an additional polymeric layer, preferably without any further layer on the second surface of said film, wherein the additional polymeric layer is preferably transparent having a haze of no more than about 30%, typically no more than about 20%, and in one embodiment no more than about 15%. In such a PV cell, the film of the present invention is outermost in the multi-layer assembly and typically exposed to the atmosphere, and said additional polymeric layer is laminated to the photovoltaic-active layer for instance using a suitable adhesive such as EVA.

According to a further aspect of the present invention, there is provided a process for the manufacture of a biaxially oriented polyester film comprising polyester (preferably polyethylene terephthalate) as defined herein, wherein the process comprises:

(i) extruding a layer of molten polyester (preferably polyethylene terephthalate) and a hydrolysis stabiliser selected from a glycidyl ester of a branched monocarboxylic acid, preferably wherein the extrusion temperature is in the range of from about 280 to about 300° C. (more preferably in the range of from about 285 to about 290° C.), wherein the monocarboxylic acid has from 5 to 50 carbon atoms, wherein the hydrolysis stabiliser is present in the extrudate in the form of its reaction product with at least some of the end-groups of said polyester, and wherein the polyester further comprises a metal cation selected from the group consisting of Group I and Group II metal cations and/or wherein said reaction product is obtained by the reaction of the hydrolysis stabiliser with the end-groups of the polyester in the presence of a metal cation selected from the group consisting of Group I and Group II metal cations;

(ii) quenching the extrudate;

(iii) stretching the quenched extrudate in two mutually perpendicular directions; and (iv) heat-setting the film, preferably at a temperature in the range of from stabilised by heat-setting at a temperature within the range of from about 200 to about 225° C.

According to a further aspect of the present invention, there is provided a method of improving the hydrolysis resistance of a biaxially oriented polyester film, said method comprising the step of reacting a polyester (preferably polyethylene terephthalate) with at least one hydrolysis stabiliser selected from a glycidyl ester of a branched monocarboxylic acid, wherein the monocarboxylic acid has from 5 to 50 carbon atoms, wherein said hydrolysis stabiliser is present in the film in the form of its reaction product with at least some of the end-groups of said polyester, and wherein said reaction product is obtained by the reaction of the hydrolysis stabiliser with the end-groups of the polyester in the presence of a metal cation selected from the group consisting of Group I and Group II metal cations. Said method further comprises the step of manufacturing said biaxially oriented polyester film as described herein, in particular comprising the steps of extruding, quenching, stretching and heat-setting steps (i) to (iv) referred to hereinabove.

According to a further aspect of the present invention, there is provided the use of a metal cation selected from the group consisting of Group I and Group II metal cations, particularly wherein said use is the use of said metal cation as a catalyst, for the purpose of improving the hydrolysis resistance of a biaxially oriented polyester film (preferably polyethylene terephthalate) comprising at least one hydrolysis stabiliser selected from a glycidyl ester of a branched monocarboxylic acid, wherein the monocarboxylic acid has from 5 to 50 carbon atoms, wherein said hydrolysis stabiliser is present in the film in the form of its reaction product with at least some of the end-groups of said polyester, and wherein said reaction product is obtained by the reaction of the hydrolysis stabiliser with the end-groups of the polyester in the presence of the Group I or Group II metal cations.

According to a further aspect of the present invention, there is provided the use of a metal cation selected from the group consisting of Group I and Group II metal cations, particularly wherein said use is the use of said metal cation as a catalyst, in combination with the use of an hydrolysis stabiliser selected from a glycidyl ester of a branched monocarboxylic acid, for the purpose of improving the hydrolysis resistance of a biaxially oriented polyester film (preferably polyethylene terephthalate), wherein the monocarboxylic acid has from 5 to 50 carbon atoms, wherein said hydrolysis stabiliser is present in the film in the form of its reaction product with at least some of the end-groups of said polyester, and wherein said reaction product is obtained by the reaction of the hydrolysis stabiliser with the end-groups of the polyester in the presence of the Group I or Group H metal cations.

According to a further aspect of the present invention, there is provided the use of a film or composite structure as defined herein as a back-plane in a photovoltaic cell.

Property Measurement

The following analyses were used to characterize the films described herein:

(i) Clarity was evaluated by measuring total luminance transmission (TLT) and haze (% of scattered transmitted visible light) through the total thickness of the film using an M57D spherical hazemeter (Diffusion Systems) according to the standard test method ASTM D1003.

(ii) Transmission Optical Density (TOD) was measured using a Macbeth Densitometer TR 927 (obtained from Dent and Woods Ltd, Basingstoke, UK) in transmission mode.

(iii) Whiteness index was measured using a Colorgard System 2000, Model/45 (manufactured by Pacific Scientific) and the principles of ASTM D 313.

(iv) Intrinsic viscosity (in units of dL/g) was measured by solution viscometry in accordance with ASTM D5225-98 (2003) on a Viscotek™ Y-501C Relative Viscometer (see, for instance, Hitchcock, Hammons & Yau in *American Laboratory* (August 1994) "The dual-capillary method for modern-day viscometry") by using a 0.5% by weight solution of polyester in o-chlorophenol at 25° C. and using the Billmeyer single-point method to calculate intrinsic viscosity:

$$\eta = 0.25\eta_{red} + 0.75(\ln \eta_{rel})/c$$

wherein:
$\eta$=the intrinsic viscosity (in dL/g),
$\eta_{rel}$=the relative viscosity,
c=the concentration (in g/dL), &
$\eta_{red}$=reduced viscosity (in dL/g), which is equivalent to $(\eta_{rel}-1)/c$ (also expressed as $\eta_{sp}/c$ where $\eta_{sp}$ is the specific viscosity).

(v) The hydrolysis resistance of the film was assessed by accelerated aging in an autoclave testing. Samples of the film are cut into strips 10 mm wide and placed in an autoclave operating at 121° C. and 1.2 bar pressure. Properties relating to the aging of the polymer were then measured at various time intervals. In particular, the tensile strength (brittleness) of the polyester was measured as the elongation to break (ETB) of the polymer. An ETB value of over 100% is typically exhibited by a film which has not been aged. In general, a film remains useful in its end-use up to the time at which its ETB is reduced to less than 10%. The preferred films of the present invention exhibit an ETB of at least 10%, after at least 56 hours, preferably at least 60 hours, preferably at least 64 hours, preferably at least 68 hours, preferably at least 72 hours, preferably at least 76 hours, preferably at least 84 hours, preferably at least 88 hours and more preferably at least 92 hours at 121° C. and 1.2 bar pressure in the accelerated ageing test described herein.

(vi) Elongation to break is measured according to test method ASTM D882. Using a straight edge and a calibrated sample cutter (10 mm+\−0.5 mm) five strips (100 mm in length) of the film are cut along the machine direction. Each sample is tested using an Instron model 3111 materials test machine, using pneumatic action grips with rubber jaw faces. Temperature (23° C.) and relative humidity (50%) are controlled. The crosshead speed (rate of separation) is 25 mm·min$^{-1}$. The strain rate is 50%. It is calculated by dividing the rate of separation by the initial distance between grips (sample length). The equipment records the elongation at break of each sample. The elongation to break ($\epsilon_B$ (%)) is defined as:

$$\epsilon_B(\%) = (\text{extension at break}/L_0) \times 100$$

where $L_0$ is the original length of the sample between grips.

(vii) The polyester film was tested for weatherability according to ISO 4892-2.

(viii) Thermal shrinkage was assessed for film samples of dimensions 200 mm×10 mm which were cut in specific directions relative to the machine and transverse directions of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature of 150° C. (by placing in a heated oven at that temperature) and holding for an interval of 30 minutes, it was cooled to room temperature and its dimensions re-measured manually. The thermal shrinkage was calculated and expressed as a percentage of the original length.

(ix) Differential scanning calorimeter (DSC) scans were obtained using a Perkin Elmer DSC 7 instrument. Polyester film samples weighing 5 mg were encapsulated into a standard Perkin Elmer aluminium DSC crucible. The film and crucible were pressed flat to ensure that the film was partially constrained in order to minimise effects of relaxation of orientation during heating. The specimen was placed in the sample holder of the instrument and heated at 80° C. per minute from 30 to 300° C. to record the relevant trace. A dry, inert purge gas (nitrogen) was used. The temperature and heat flow axis of the DSC instrument were fully calibrated for the experimental conditions, i.e. for the heating rate and gas flow rate. The values for the peak temperatures, i.e. the endothermic high temperature peak (A) and endothermic low temperature peak (B), were taken as the maximum displacement above a baseline drawn from the onset of each endothermic melting process to the end of each endothermic melting process. Peak temperature measurements were derived using standard analysis procedures within the Perkin Elmer software. Precision and accuracy of the measurements was ±2° C. A sample plot is shown in FIG. 1.

The invention is illustrated by reference to FIG. 1, a typical DSC scan (heat flow versus temperature) obtained for a polyester film according to the invention. The peak marked (A) in FIG. 1 is the endothermic high temperature peak having a value of 250° C., and the peak marked (B) is the endothermic low temperature peak having a value of 220° C., and so the value (A–B) is (250–220)=30° C.

The invention is further illustrated by the following examples. The examples are not intended to limit the invention as described above. Modification of detail may be made without departing from the scope of the invention.

EXAMPLES

Control 1

Comparative Examples 1 and 2

Examples 1 to 12

A first series of polyester films was prepared by metering Cardura™ E10P (flexion Specialty Chemicals, Ohio, US; density 0.97 g/cm$^3$) as hydrolysis stabiliser directly into a PET melt stream in a film-line twin-screw extruder, i.e. once the polyester was in the molten state, at pre-determined flow-rates (0, 800 or 960 ml/hr), as shown in Table 1 below, in order to provide the final film with hydrolysis stabiliser in varying amounts. The flow rate of the PET was 93.3 kg/hr. The PET contained Dispex G40 (Ciba/BASF; sodium salt of an acrylic copolymer; supplied as a 40% solids aqueous dispersion) in amounts of 0, 250, 500 or 1000 ppm (by weight relative to the final weight of the polymer produced), which was added at the start of the polymerisation process, along with the terephthalic acid and ethylene glycol. The PET polymer further contained $TiO_2$ in an amount of 0.3 wt % by weight of the polyester, as well as $SiO_2$ in an amount of 0.3 wt % by weight of the polyester. The PET polymer chip had an intrinsic viscosity of 0.79.

The mixture was melt extruded at 285° C., cast onto a cooled rotating drum and stretched in the direction of extrusion to approximately 2.9 times its original dimensions at a temperature of 86° C. The cooled stretched film was then passed into a stenter oven at a temperature of 110° C. where the film was dried and stretched in the sideways direction to approximately 3.4 times its original dimensions. The biaxially stretched film was heat-set at a temperature of either 220° C. or 232° C. The final thickness of the resulting film was 50 µm. The film was translucent with a TLT of 76%, and a haze of 66%. The hydrolysis resistance of the film was assessed by measuring its elongation to break before and after accelerated ageing, as defined herein. The amount of hydrolysis stabiliser in the final film may be measured by $^1$H NMR (D2-1,1,2,2-tetrachloroethane as solvent; GSX-Delta 400 instrument at 80° C.).

The results in Table 1 demonstrate that the hydrolysis stabiliser improves the hydrolysis resistance of the polyester film even in the absence of the sodium ions provided by the Dispex additive (as is evident when Comparative Examples 1 and 2 are compared with Control 1), but that an even greater improvement in hydrolysis resistance is observed upon the addition of the sodium ions provided by the Dispex additive (as is evident, for instance, when Examples 1 to 3 are compared with Comparative Example 1).

In all of the Examples according to the invention described above, the film uniformity and film quality were excellent, with a very low level of die-lines or profile defects; there was no odour detected around the film die; and all films demonstrated good processability.

Comparative Examples 3 and 4

Examples 13 to 20

A second series of polyester films was prepared using the procedure described above, except that the PET polymer contained 500 ppm Irganox™ 1010 (Ciba-Geigy) added at the start of the polymerisation process, but did not contain $TiO_2$ or $SiO_2$, and the films were optically clear. The PET contained Dispex G40 in an amount of 500 ppm (by weight relative to the final weight of the polymer produced) added at the start of the polymerisation process. The hydrolysis resistance of the film was measured as before, and the results are presented in Table 2. The data demonstrate that the surprising effect of the combination of hydrolysis stabiliser and metal cation is also exhibited for films of the present invention which are filler-free. The films of this second series generally exhibit hydrolysis resistance which is superior to that of the films of the first series, and the inventors attribute this difference to the absence of filler in the second series, since filler particles can act as a nucleant for additional crystallisation which leads to greater embrittlement.

Comparative Example 5

Example 21

In these examples, the polymerisation and film manufacturing processes were linked via a static mixing device in a close-coupled arrangement as described hereinabove. The PET polymer was prepared by trans-esterification of dimethylterephthalate (DMT) and ethylene glycol and polymerised under vacuum in accordance with standard techniques. The Dispex additive was injected to the monomer stream before the polymerisation stage, and in an amount of 500 ppm. The Cardura additive was injected into the polymer stream after the polymerisation reactor, and in an amount to provide 0.5 wt % in the final polymer. The film was otherwise manufactured generally in accordance with the procedure described above except that the final film was 125 µm in thickness and the crystalliser temperature was 228° C. The results are presented in Table 3.

TABLE 1

| | Cardura Flow rate (ml/hr) | Dispex additive (ppm) | ETB (%) after ageing for x hours | | | | | | | | | | |
|---|---|---|---|---|---|---|---|---|---|---|---|---|---|
| | | | 0 | 52 | 56 | 60 | 68 | 72 | 76 | 84 | 88 | 92 | 96 | 100 |
| (i) heat-set temperature = 220° C. | | | | | | | | | | | | | |
| Cont.1 | 0 | 0 | 188.36 | 13.1 | 3.43 | 2.46 | 2.1 | 1.45 | 0 | 0 | 0 | 0 | 0 | 0 |
| C. Ex. 1 | 800 | 0 | 172.6 | 106.01 | 90.16 | 37.94 | 4.36 | 2.37 | 0 | 0 | 0 | 0 | 0 | 0 |
| Ex. 1 | 800 | 250 | 180.26 | 176.69 | 156.91 | 154.51 | 126.36 | 105.97 | 8.55 | 3.05 | 2.13 | 1.2 | 0 | 0 |
| Ex. 2 | 800 | 500 | 163.68 | 175.32 | 185.77 | 175.08 | 172.36 | 163.53 | 159.38 | 127.09 | 104.4 | 11.78 | 6.37 | 4.63 |
| Ex. 3 | 800 | 1000 | 167.21 | 164.72 | 158.24 | 140.47 | 139.6 | 139.61 | 149.6 | 132.95 | 124.05 | 59.74 | 9.8 | 3.52 |
| C. Ex. 2 | 960 | 0 | 175.23 | 148.18 | 86.61 | 73.12 | 4.63 | 3.28 | 1.26 | 0 | 0 | 0 | 0 | 0 |
| Ex. 4 | 960 | 250 | 180.93 | 163.42 | 146.04 | 131.05 | 112.36 | 92.74 | 16.04 | 3.04 | 0 | 0 | 0 | 0 |
| (ii) heat-set temperature = 232° C. | | | | | | | | | | | | | |
| Ex. 5 | 0 | 250 | 182.21 | 18 | 3.09 | 3.07 | 1.65 | 1.73 | 1.2 | 0.16 | 1.18 | 0 | 0 | 0 |
| Ex. 6 | 0 | 500 | 192.81 | 39.62 | 4.23 | 3.31 | 1.5 | 1.5 | 1.1 | 0.33 | 1.14 | 0 | 0 | 0 |
| Ex. 7 | 0 | 1000 | 182.3 | 16.78 | 5.47 | 3.87 | 4.32 | 2.29 | 0.78 | 1.36 | 1.19 | 0 | 0 | 0 |
| Ex. 8 | 800 | 250 | 188.45 | 174.67 | 131.67 | 115.79 | 84.36 | 6.41 | 4.32 | 2.37 | 1.36 | 1.33 | 0 | 0 |
| Ex. 9 | 800 | 500 | 187.71 | 207.28 | 181.64 | 171.33 | 156.39 | 135.43 | 71.68 | 27.81 | 6.82 | 3.27 | 2.78 | 2.865 |
| Ex. 10 | 800 | 1000 | 199.78 | 179.3 | 171.04 | 162.67 | 121.3 | 91.42 | 126.47 | 97.58 | 9.2 | 3.74 | 2.36 | 2.21 |
| Ex. 11 | 960 | 250 | 185.29 | 172.67 | 156.01 | 134.51 | 106.96 | 80.97 | 8.34 | 1.39 | 0 | 0 | 0 | 0 |
| Ex. 12 | 960 | 500 | 189.94 | 170.96 | 165.35 | 161.44 | 142.36 | 132.53 | 108.59 | 30.36 | 11.89 | 3.54 | 3 | 2.88 |

TABLE 2

| | Cardura Flow rate (ml/hr) | Dispex additive (ppm) | ETB (%) after ageing for x hours | | | | | | | | | | |
|---|---|---|---|---|---|---|---|---|---|---|---|---|---|
| | | | 0 | 40 | 48 | 60 | 72 | 80 | 84 | 88 | 92 | 96 | 100 |
| (i) heat-set temperature = 220° C. | | | | | | | | | | | | | |
| C. Ex. 3 | 0 | 500 | 152.32 | 134.01 | 124.14 | 88.32 | 3.88 | 2.99 | 2.12 | 0 | 0 | 0 | 0 |
| Ex. 13 | 360 | 500 | 144.01 | 160.19 | 163.37 | 132.31 | 116.66 | 61.83 | 17.3 | 5.28 | 3.26 | 2.62 | 0 |
| Ex. 14 | 520 | 500 | 130.19 | 149.45 | 150.96 | 127.2 | 120.37 | 69.94 | 52.85 | 23.55 | 3.47 | 3.7 | 0 |
| Ex. 15 | 640 | 500 | 153.26 | 168.87 | 140.76 | 137.7 | 136.43 | 121.33 | 86.64 | 64.68 | 32.7 | 9.86 | 3.71 |
| Ex. 16 | 800 | 500 | 135.06 | 165.51 | 147.91 | 133.55 | 130.41 | 94.5 | 112.91 | 86.77 | 46.06 | 16.71 | 5.5 |
| (ii) heat-set temperature = 232° C. | | | | | | | | | | | | | |
| C. Ex. 4 | 0 | 500 | 165.32 | 154.65 | 107.48 | 45.23 | 2.2 | 1.75 | 1.49 | 0 | 0 | 0 | 0 |
| Ex. 17 | 360 | 500 | 156 | 144.52 | 139.41 | 111.87 | 16.83 | 3.67 | 2.16 | 1.35 | 0 | 0 | 0 |
| Ex. 18 | 520 | 500 | 164 | 146.32 | 138.09 | 98.2 | 32.18 | 3.25 | 3.37 | 1.24 | 0 | 0 | 0 |
| Ex. 19 | 640 | 500 | 175.53 | 153.11 | 150.69 | 133.06 | 87.26 | 30.29 | 31.01 | 3.31 | 2.58 | 0.92 | 0 |
| Ex. 20 | 800 | 500 | 158.48 | 164.23 | 161.21 | 161.64 | 102.05 | 13.53 | 8.11 | 2.47 | 3.36 | 0 | 0 |

TABLE 3

| | Cardura Amount (wt %) | Dispex additive (ppm) | ETB (% of initial value) after ageing for x hours | | | | | | | | |
|---|---|---|---|---|---|---|---|---|---|---|---|
| | | | 0 | 52 | 60 | 64 | 72 | 76 | 84 | 88 | 92 |
| C. Ex. 5 | 0 | 500 | 100 | 87 | 48 | 2.9 | 1.7 | 1.2 | n/m | n/m | n/m |
| Ex. 21 | 0.5 | 500 | 100 | n/m | n/m | n/m | n/m | n/m | 55 | 37 | 30 | n/m = not measured

The invention claimed is:

1. A biaxially oriented polyester film comprising polyester and at least one hydrolysis stabiliser selected from a glycidyl ester of a branched monocarboxylic acid in the absence of glycidyl ether compound(s), wherein said polyester is polyethylene terephthalate, wherein the monocarboxylic acid has from 5 to 50 carbon atoms, wherein said hydrolysis stabiliser has formula (I):

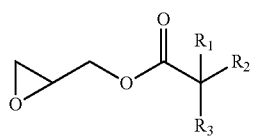

wherein:

$R^1$ and $R^2$ are independently selected from alkyl;

$R^3$ is selected from hydrogen and alkyl; and wherein the total number of carbon atoms in the alkyl groups $R^1$, $R^2$ and $R^3$ is from 3 to 48;

wherein said hydrolysis stabiliser is present in the film in the form of its reaction product with at least some of the end-groups of said polyester, wherein the hydrolysis stabiliser is present in an amount in the range from 0.3% to 1.5%, relative to the total weight of the film and wherein said reaction product is obtained by the reaction of the hydrolysis stabiliser with the end-groups of the polyester in the presence of sodium cations, wherein the amount of the sodium cations present in the film, and/or present in the reaction mixture during the reaction of the hydrolysis stabiliser with the end-groups of the polyester, is at least 45 ppm by weight, relative to the amount of polyester, wherein the film exhibits an elongation to break, measured according to ASTM D882, of at least 10% after at least 76 hours when aged at 121° C. and 1.2 bar pressure.

2. The polyester film according to claim 1, wherein the intrinsic viscosity of the polyester in the polyester film is at least about 0.65 as measured according to ASTM D5225-98 (2003).

3. The polyester film according to claim 1, wherein the hydrolysis stabiliser(s) in the polyester film consist(s) essentially of at least one glycidyl ester of a branched monocarboxylic acid.

4. The polyester film according to claim 1, wherein said branched monocarboxylic acid has from 5 to 15 carbon atoms, and/or wherein said branched monocarboxylic acid is saturated, and/or said branched monocarboxylic acid is a synthetic material.

5. The polyester film according to claim 1, wherein said hydrolysis stabiliser is manufactured by the reaction of epichlorohydrin with said branched monocarboxylic acid.

6. The polyester film according to claim 1 wherein $R^1$ is selected from methyl, and $R^2$ and $R^3$ are independently selected from alkyl, wherein the total number of carbon atoms in the alkyl groups $R^2$ and $R^3$ is 7.

7. The polyester film according to claim 1, wherein said hydrolysis stabiliser is reacted with the polyester by injecting the additive into the molten polymer prior to the polymer being cast into a film.

8. The polyester film according to claim 1, wherein the polyester film further comprises a UV-absorber.

9. The polyester film according to claim 8 wherein the amount of UV-absorber is in the range from 0.1% to 10% by weight, relative to the total weight of the layer.

10. The polyester film according to claim 1, wherein the polyester film has been stabilised by heat-setting at a temperature within the range of from about 200 to about 225° C.

11. The polyester film according to claim 1, wherein the polyester of the polyester film exhibits an endothermic high temperature peak at a temperature of (A)° C. and an endothermic low temperature peak at a temperature of (B)° C., both peaks being measured by differential scanning calorimetry (DSC), wherein the value of (A-B) is in the range from 15° C. to 50° C.

12. The polyester film according to claim 1, wherein the polyester film exhibits a haze of no more than 30% and/or a TLT of at least 50%.

13. The polyester film according to claim 1, wherein the polyester film is selected from the group consisting of a white film, a black film and an opaque film.

14. The polyester film according to claim 1, further comprising an anti-oxidant.

15. The polyester film according to claim 1, wherein the polyester film has disposed on a first surface thereof an additional polymeric layer, wherein said additional polymeric layer is a polyester layer optionally comprising one or more additives independently selected from hydrolysis stabiliser(s), UV-absorber(s), anti-oxidant(s) and particulate inorganic filler(s).

16. The polyester film according to claim 1, further comprising one or more additional layer(s) disposed on one or both surfaces thereof to form a composite structure.

17. The polyester film according to claim 16, wherein the one or more additional layer(s) is selected from PET or PET-based polyesters.

18. The polyester film according to claim 16, wherein the one or more additional layer(s) comprises at least one hydrolysis stabiliser.

19. The polyester film according to claim 18, wherein the one or more additional layer(s) is selected from PET or PET-based polyesters, and wherein the hydrolysis stabiliser in the one or more additional layer(s) is selected from a glycidyl ester of a branched monocarboxylic acid, wherein the monocarboxylic acid has from 5 to 50 carbon atoms, wherein said hydrolysis stabiliser is present in the one or more additional layer(s) in the form of its reaction product with at least some of the end-groups of the polyester.

20. The polyester film according to claim 19, wherein the hydrolysis stabiliser in the one or more additional layer(s) has formula (I):

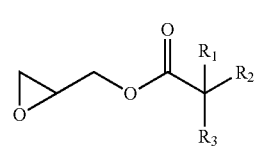

(I)

wherein:

$R^1$ and $R^2$ are independently selected from alkyl;

$R^3$ is selected from hydrogen and alkyl; and wherein the total number of carbon atoms in the alkyl groups $R^1$, $R^2$ and $R^3$ is from 3 to 48.

21. The polyester film according to claim 16, wherein the polyester film is formed by co-extrusion of the respective film-forming layers.

22. The polyester film as described in claim 1 used as a layer in a photovoltaic cell, said photovoltaic cell comprising a front-plane, electrode layer(s), a photovoltaic-active layer, and a back-plane.

23. A photovoltaic cell comprising a front-plane, electrode layer(s), a photovoltaic-active layer, and a back-plane, wherein the front-plane and/or the back-plane comprises a polyester film as defined in claim 1.

24. A photovoltaic cell comprising a front-plane, electrode layer(s), a photovoltaic-active layer, and a back-plane, wherein said electrode layers and photovoltaic-active layer are encapsulated in an encapsulant, and wherein the back-plane and optionally the front-plane comprises a polyester film as defined in claim 1.

25. The photovoltaic cell according to claim 24, wherein said polyester film is an opaque or white film, wherein said polyester film has disposed on a first surface thereof an additional polymeric layer, wherein said additional polymeric layer exhibits a haze of no more than about 30%, and wherein said film is outermost in the multi-layer assembly.

26. A process for the manufacture of a biaxially oriented polyester film according to claim 1, wherein the process comprises:
(i) extruding a layer of molten polyester and at least one hydrolysis stabiliser selected from a glycidyl ester of a branched monocarboxylic acid in the absence of glycidyl ether compound(s), wherein the monocarboxylic acid has from 5 to 50 carbon atoms, wherein said hydrolysis stabiliser has formula (I):

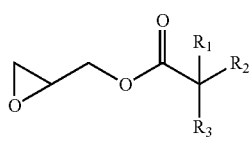

(I)

wherein:
$R^1$ and $R^2$ are independently selected from alkyl;
$R^3$ is selected from hydrogen and alkyl; and
wherein the total number of carbon atoms in the alkyl groups $R^1$, $R^2$ and $R^3$ is from 3 to 48;
(ii) wherein said hydrolysis stabiliser is present in the extrudate in the form of its reaction product with at least some of the end-groups of said polyester, wherein the hydrolysis stabiliser is present in an amount in the range from 0.3% to 1.5%, relative to the total weight of the film and wherein said reaction product is obtained by the reaction of the hydrolysis stabiliser with the end-groups of the polyester in the presence of sodium cations, wherein the amount of the sodium cations present in the film, and/or present in the reaction mixture during the reaction of the hydrolysis stabiliser with the end-groups of the polyester, is at least 45 ppm by weight, relative to the amount of polyester;
(iii) quenching the extrudate;
(iv) stretching the quenched extrudate in two mutually perpendicular directions; and
(v) heat-setting the film;
wherein the film exhibits an elongation to break, measured according to ASTM D882, of at least 10% after at least 76 hours when aged at 121° C. and 1.2 bar pressure.

27. The process according to claim 26, wherein the process comprises the further step of manufacturing said hydrolysis stabiliser by the reaction of epichlorohydrin with said branched monocarboxylic acid.

28. The process according to claim 26, wherein the hydrolysis stabiliser is reacted with the polyester by injecting the additive into the molten polymer prior to extruding said layer.

29. The process according to claim 26, wherein the film has one or more additional layer(s) disposed on one or both surfaces thereof to form a composite structure and wherein the process comprises co-extrusion of the respective film-forming layers.

30. A method of improving the hydrolysis resistance of a biaxially oriented polyester film, said method comprising the step of reacting said polyester with at least one hydrolysis stabiliser selected from a glycidyl ester of a branched monocarboxylic acid in the absence of glycidyl ether compound(s), wherein the monocarboxylic acid has from 5 to 50 carbon atoms, wherein said hydrolysis stabiliser has formula (I):

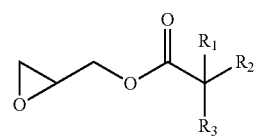

(I)

wherein:
$R^1$ and $R^2$ are independently selected from alkyl;
$R^3$ is selected from hydrogen and alkyl; and
wherein the total number of carbon atoms in the alkyl groups $R^1$, $R^2$ and $R^3$ is from 3 to 48;
wherein said hydrolysis stabiliser is present in the film in the form of its reaction product with at least some of the end-groups of said polyester, wherein the hydrolysis stabiliser is present in an amount in the range from 0.3% to 1.5%, relative to the total weight of the film and wherein said reaction product is obtained by the reaction of the hydrolysis stabiliser with the end-groups of the polyester in the presence of sodium cations, wherein the amount of the sodium cations present in the film, and/or present in the reaction mixture during the reaction of the hydrolysis stabiliser with the end-groups of the polyester, is at least 45 ppm by weight, relative to the amount of polyester, wherein the film exhibits an elongation to break, measured according to ASTM D882, of at least 10% after at least 76 hours when aged at 121° C. and 1.2 bar pressure.

* * * * *